(12) United States Patent
Shi et al.

(10) Patent No.: US 7,327,208 B2
(45) Date of Patent: Feb. 5, 2008

(54) PRINTED CIRCUIT BOARD INCLUDING A NOTCH FILTER FOR ATTENUATING RADIO FREQUENCY INTERFERENCE

(75) Inventors: Wulin Shi, Shanghai (CN); Frank Xiaohui Li, Shanghai (CN)

(73) Assignee: Spreadtrum Communications Corporation, Sunnyvale, CA (US)

( * ) Notice: Subject to any disclaimer, the term of this patent is extended or adjusted under 35 U.S.C. 154(b) by 227 days.

(21) Appl. No.: 11/066,885

(22) Filed: Feb. 24, 2005

(65) Prior Publication Data

US 2006/0186970 A1  Aug. 24, 2006

(51) Int. Cl.
*H03H 7/01* (2006.01)
*H01P 3/08* (2006.01)
*H01P 9/02* (2006.01)

(52) U.S. Cl. ............... 333/176; 333/200; 333/161; 333/162; 333/204

(58) Field of Classification Search ............. 333/200, 333/84 R, 128 R, 161, 162, 204, 238, 246, 333/81 R, 128, 176
See application file for complete search history.

(56) References Cited

U.S. PATENT DOCUMENTS

| | | | | |
|---|---|---|---|---|
| 3,718,874 A | * | 2/1973 | Cooper, Jr. ............... | 333/204 |
| 5,426,404 A | * | 6/1995 | Kommrusch et al. ....... | 333/246 |
| 5,499,005 A | * | 3/1996 | Gu et al. .................. | 333/246 |
| 6,215,372 B1 | * | 4/2001 | Novak ........................ | 333/12 |
| 6,289,204 B1 | * | 9/2001 | Estes et al. ............... | 455/78 |

* cited by examiner

*Primary Examiner*—Robert Pascal
*Assistant Examiner*—Kimberly E Glenn
(74) *Attorney, Agent, or Firm*—Perkins Coie LLP

(57) ABSTRACT

A printed circuit board (PCB) including a notch filter, or other suitable filter, is implemented in a communication device for attenuating RFI in transmissions sent from the communication device. The filter includes filter line that runs between at least two conductor layers on the PCB, in a substantially repeating pattern, which maximizes the space available on each conductor layer for additional uses.

13 Claims, 2 Drawing Sheets

PRINTED CIRCUIT BOARD INCLUDING A NOTCH FILTER FOR ATTENUATING RADIO FREQUENCY INTERFERENCE

BACKGROUND OF INVENTION

In the field of telecommunications, duplex, or "two-way," communication channels are commonly used. A full-duplex channel is a channel which can carry information in outgoing and incoming directions at one time. Several duplexing methods are commonly used for separating forward and reverse communication channels on the same physical communications medium.

Time division duplexing (TDD), for example, is commonly used to separate a telecommunication device's outgoing and incoming signals. Time division duplexing is particularly effective when uplink and downlink data speed is variable. For example, as the amount of uplink data increases, more bandwidth can be allocated to handle that data, and as it shrinks, less bandwidth can be allocated to handle that data.

One common problem associated with TDD communications equipment, such as TDD handsets, is electromagnetic interference (EMI), also known as radio frequency interference (RFD). Because TDD communications switches from transmit to receive mode at a high rate, this switching noise may cause RFI. RFI is any electromagnetic disturbance that interrupts, obstructs, or otherwise degrades or limits the effective performance of electronic or electrical equipment. RFI may be induced intentionally or unintentionally, as a result of unauthentic emissions and responses, intermodulation products, and other causes. TDD handset transmissions are often degraded by RFI.

Several attempts have been made to reduce or eliminate RFI associated with TDD handset transmissions. For example, passive filters, such as LC filters (i.e., inductance/capacitance filters), have been implemented on printed circuit boards (PCBs) used in TDD handsets to reduce RFI. These LC filters, however, are generally expensive, and typically occupy a significant portion of the available surface area on a PCB. Furthermore, an LC filter typically includes a bared lead wire that can reduce the ability of the LC filter to attenuate RFI.

Ring-structured filter devices have also been implemented on PCBs in TDD handsets to reduce RFI. In certain mediums, such as those typically used to construct PCBs, however, ring-structured devices often have a decreased effect, which leads to reduced RFI attenuation. For example, in a typical 4 mm×2 mm PCB, a ring-structured filter device can generally attenuate the RFI of a 900 MHz transmission (i.e., a standard GSM transmission frequency) by approximately only 10 dB.

While this degree of RFI attenuation is somewhat effective, several decibals of "noise" may, in some cases, still be present in the transmission, which can obstruct or degrade the transmission. As a result, the transmission may be unclear, and may not be decipherable in its entirety, or at all, by the intended recipient. Thus, a need exists for a filter that can be implemented on a PCB in a TDD handset, or similar device, to better attenuate RFI, while occupying a minimal amount of PCB surface area.

SUMMARY OF THE INVENTION

A printed circuit board (PCB) including a notch filter, or other suitable filter, is implemented in a communication device for attenuating RFI in transmissions sent from the communication device. The filter includes a filter line that runs between at least two conductor layers on the PCB, thereby maximizing the space available on each conductor layer for additional uses, such as for mounting devices.

In a first aspect, a communication device includes a PCB having a first conductor layer, a second conductor layer, and a first substrate layer between the first and second conductor layers. A filter line is formed in and runs between the first and second conductor layers in a substantially repeating pattern.

In another aspect, a sufficient length of filter line is formed in the first and second conductor layers to attenuate noise associated with a 900 MHz transmission frequency by at least 30 dB.

In another aspect, the filter line is 40 to 50 mm in length.

In another aspect, the filter line includes an open end.

In another aspect, the first substrate layer includes a plurality of holes through which the filter line runs between the first and second conductor layers.

In another aspect, the PCB further includes a signal line connected to the filter line for receiving an incoming signal, sending at least a first portion of the signal to the filter line, and transmitting at least a second portion of the signal.

In another aspect, the PCB further includes a second substrate layer on top of the first conductor layer, and a third substrate layer beneath the second conductor layer.

In another aspect, the printed circuit board further includes a first ground layer on top of the second substrate layer, and a second ground layer beneath the third substrate layer.

In another aspect, the first substrate layer includes a material having a dielectric constant of at least 4.0.

In another aspect, the PCB further includes a third conductor layer beneath the third substrate layer, a fourth substrate layer beneath the third conductor layer, a fourth conductor layer beneath the fourth substrate layer, and a fifth substrate layer beneath the fourth conductor layer.

In another aspect, the filter line is formed in and runs between the first, second, third, and fourth conductor layers in a substantially repeating pattern.

In another aspect, a printed circuit board for filtering RFI from transmissions sent by a communication device includes a first conductor layer, a second conductor layer, and a substrate layer between the first and second conductor layers. The substrate layer includes a plurality of holes. A filter line runs in a substantially repeating pattern between the first and second conductor layers. The pattern includes the filter line running along the first conductor layer in at least a first direction, then through a first hole in the substrate layer leading to the second conductor layer, then along the second conductor layer in at least a second direction, then through a second hole in the substrate layer leading back to the first conductor layer. The pattern is repeated at least once, with the filter line running through at least two additional holes in the substrate layer.

In another aspect, a communication device includes a printed circuit board having a first conductor layer, a second conductor layer, and a first substrate layer between the first and second conductor layers. A filter means is formed in and runs between the first and second conductor layers in a substantially repeating pattern for filtering RFI from transmissions sent by the communication device.

Other features and advantages of the invention will appear hereinafter. The features of the invention described above can be used separately or together, or in various combinations of one or more of them. The invention resides as well in sub-combinations of the features described.

BRIEF DESCRIPTION OF THE DRAWINGS

In the drawings, wherein the same reference number indicates the same element throughout the several views.

DETAILED DESCRIPTION OF THE DRAWINGS

The printed circuit boards (PCBs) described herein may be utilized in any suitable communication device for the purpose of attenuating radio frequency interference (RFI) in transmissions sent by the communication device. For ease of description, the PCBs will be described as being implemented in time division duplexing (TDD) handsets, by way of example only.

Figure 1:
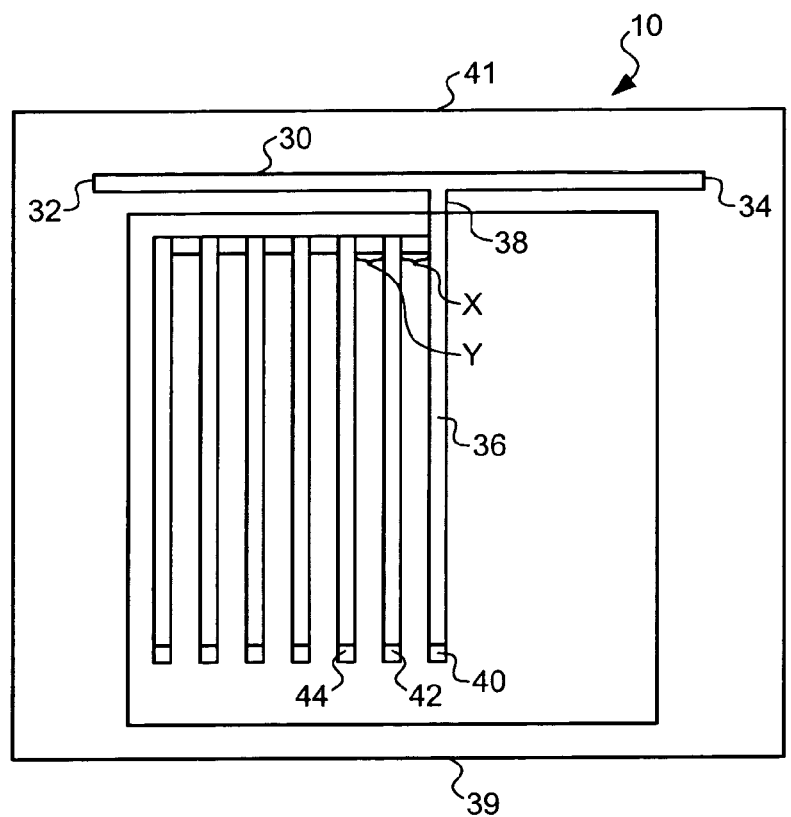
FIG. 1 is a top plan view of a PCB including a notch filter according to one preferred embodiment.
Figure 2:
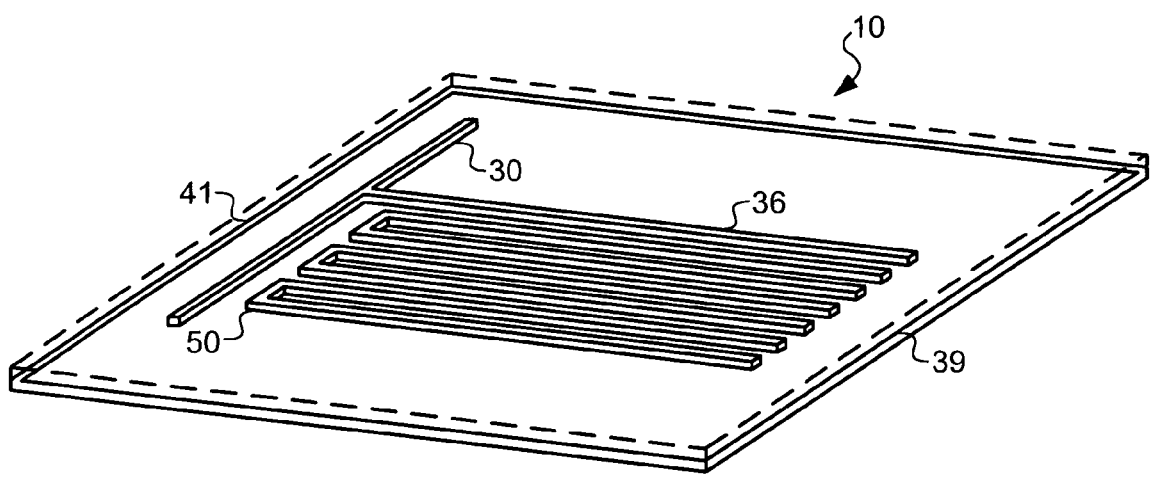
FIG. 2 is left-front perspective view of the PCB shown in FIG. 1.
Figure 3:
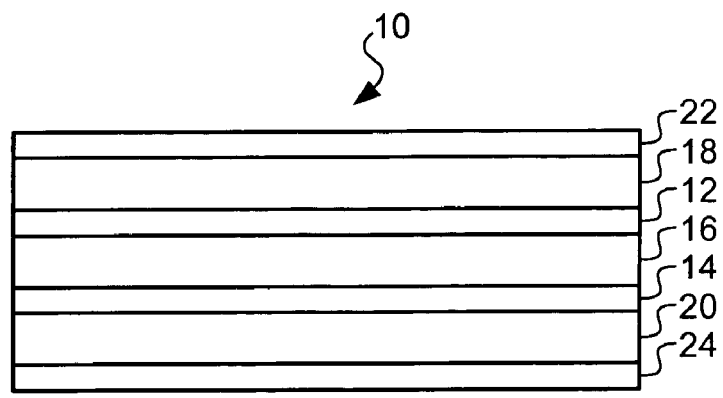
FIG. 3 is a side-sectional view of the layers of the PCB shown in FIGS. 1 and 2.

FIGS. 1-3 illustrate a PCB 10 according to one preferred embodiment. As is best shown in the layered view of FIG. 3, the PCB 10 includes a first conductor layer 12, a second conductor layer 14, and a first substrate layer 16 located between the first and second conductor layers 12, 14. The PCB 10 also preferably includes a second substrate layer 18 on top of the first conductor layer 12, and a third substrate layer 20 beneath the second conductor layer 14. Each substrate layer preferably has a thickness of approximately 80 to 120 micrometers, or 90 to 110 micrometers, or 100 micrometers. The PCB further preferably includes a first power or ground layer 22 on top of the second substrate layer 18, and a second power or ground layer 24 beneath the third substrate layer 20.

The PCB 10 may optionally include a greater number of conductor layers, as described in detail below. The PCB 10 may also include a greater or lesser number of substrate layers, and does not necessarily have to include one or both power or ground layers. Any suitable PCB configuration, including at least two conductor layers, is contemplated herein. The respective layers may be glued or otherwise adhered or connected to one another in any suitable manner.

The first and second conductor layers 12, 14, as well as the ground layers 22, 24, are preferably made of a foil material, such as a copper foil, or from a similar suitable conductor or ground material. The first, second, and third substrate layers 16, 18, 20 are preferably made of a plastic material or similar material, such as an epoxy glue reinforced with fiberglass. In a preferred embodiment, the substrate layers are made of one or more materials having a dielectric constant greater than 4.0, which provides a relatively low equivalent wavelength of signals transmitted through the PCB 10, as described in detail below. FR4 ("Flame Retardant 4"), which is a fiberglass material commonly used in the manufacture of PCBs, and which has a dielectric constant of approximately 4.3, is an example of a suitable substrate material.

A signal trace or line 30 is laid out on or formed in one of the conductor layers, preferably the first conductor layer 12, as described below. The signal line 30 is preferably a substantially flat, narrow portion of the foil that remains after etching, or otherwise removing, a portion of the first conductor layer 12, as is well known in the art. The signal line 30 is preferably substantially straight, and includes a "signal in" end 32 and a "signal out" end 34.

A filter line 36 is laid out on or formed in (via foil etching, etc.) the first and second conductor layers 12, 14, preferably in a substantially repeating pattern, as described below, to form a notch filter, or similar filter, in the PCB 10. A notch filter is a type of band-stop filter that attenuates a particularly narrow range of frequencies, typically when the highest and lowest frequencies are less than 1 to 2 decades apart (i.e., when the highest frequency is less than 10 to 20 times the lowest frequency). For example, a typical "anti-presence" notch filter may attenuate frequencies only between 1000 and 4000 Hz, and allow all frequencies not within these limits to pass.

The filter line 36 preferably includes a first end 38 that connects into the signal line 30. In a preferred embodiment, the filter line 36 runs from the signal line 30 substantially across the length of the first conductor layer 12 toward a first end 39 of the PCB 10, and then passes through a first hole 40, or via, in the first substrate layer 16 between the first and second conductor layers 12, 14. The filter line 36 exits the first hole 40 and continues to run on or in the second conductor layer 14 toward the opposing second end 41 of the PCB 10. The filter line 36 then runs a short perpendicular distance X, after which it runs back along the second conductor layer 14 toward the first end 39 of the PCB 10. The filter line 36 then passes through a second hole 42, or via, in the first substrate layer 16 between the first and second conductor layers 12, 14, up to the first conductor layer 12.

The filter line 36 exits the second hole 42 and runs on or in the first conductor layer 12 toward the opposing second end 41 of the PCB 10. The filter line 36 then runs a short perpendicular distance Y, after which it runs back along the first conductor layer 12 toward the first end 39 of the PCB 10. The filter line 36 then passes through a third hole 44, or via, in the first substrate layer 16 between the first and second conductor layers 12, 14, down to the second conductor layer 14. The pattern described above is then repeated, as is best shown in FIG. 2, until a desired length of filter line 36 is laid out on or in the first and second conductor layers 12, 14. The filter line 36 preferably terminates at an open end 50. Open-end filter line is preferably used because it has little or no effect on the transmission of low-frequency signals.

In an alternative embodiment, a PCB may include a greater number of conductor layers, on or in which the filter line 36 may be laid out. For example, a PCB may include four conductor layers, and a substantially equal length of filter line 36 may be laid out on or in each of the four conductor layers in the manner described above, or in any other suitable pattern. In this 4-layered embodiment, the filter line 36 occupies less of the available surface area on each conductor layer, as compared to a PCB 10 having only two conductor layers with an equal amount of total filter line 36, which leaves more space available on each conductor layer for other uses, such as for mounting devices. It can be appreciated that more layers may be used, such as using an 8-layer PCB.

In another alternative embodiment, more than one PCB may be used to create a notch filter that is equivalent to the 2-layered or 4-layered PCBs described above. For example, two PCBs, each having two conductor layers, may include substantially the same length of filter line 36 on each conductor layer as that which is included on each conductor layer in a 4-layered PCB, while leaving approximately the same amount of available conductor space, on each PCB layer, for other uses. The two PCBs may then be inserted into a TDD handset, or other communication device, in series, for filtering RFI in a manner equivalent to that of a single 4-layered PCB.

The total length of filter line 36 laid out on or in the PCB 10 is preferably dictated by the transmission frequency of the device in which the PCB(s) 10 will be used. The wavelength of a radio wave or other wave is generally equal to the speed of the wave divided by the frequency of the wave. In a vacuum, this wave speed is equal to the speed of light. This relationship is given by:

$$\lambda = c/f$$

where:
$\lambda$=wavelength of the wave
c=speed of light in a vacuum ~300,000 km/s=300,000,000 m/s
f=frequency of the wave In a typical GSM TDD handset, transmissions are made at or about 900 MHz. The wavelength of a transmitted wave is therefore determined by dividing the speed of light ($3 \times 10^8$ m/s) by the transmission frequency ($900 \times 10^6$ Hz), which is approximately equal to 0.33 m.

The equivalent wavelength of the wave in the PCB medium is given by:

$$\lambda' = \lambda_0 / \sqrt{\epsilon}$$

where:
$\lambda'$=equivalent wavelength of the wave in the PCB substrate
$\lambda_0$=the vacuum wavelength of the wave
$\epsilon$=the dielectric constant of the substrate material in the PCB Thus, if FR4, for example, which has a dielectric constant of approximately 4.3, is used as the PCB substrate material, the equivalent wavelength of a radio wave, transmitted at 900 MHz, in the PCB 10 is approximately equal to 0.33 m/$\sqrt{4.3}$, or 0.16 m.

In a preferred embodiment, to effectively eliminate noise associated with a TDD transmission, a notch filter including a length of filter line 36 approximately equal to one quarter the equivalent wavelength of a radio wave is required. Thus, a filter line 36 of approximately 0.040 m (¼×0.16 m), or 40 mm, is required to effectively attenuate noise associated with a 900 MHz transmission, in a PCB substrate having a dielectric constant of approximately 4.3. The filter line 36 may be laid out on any suitable number of conductor layers, over any suitable length on each layer, any suitable number of times, to reach the desired filter line length.

For example, as shown in FIGS. 1 and 2, seven lengths of filter line 36, each running approximately 2.5 to 4 mm, may be laid out on or in each conductor layer 12, 14, to reach the desired overall filter line length. Alternatively, in one of the alternative PCB designs described above, four lengths of filter line 36, each running approximately 1.0 to 2.0 mm, may be laid out on or in each of four conductor layers. Any suitable PCB layout is contemplated herein. In general, the filter line 36 is preferably 35 to 60 mm in total length, more preferably 40 to 50 mm in total length, for filtering out noise associated with 900 MHz transmissions, using a PCB substrate having a dielectric constant greater than 4.0. Other filter lengths may of course be used, particularly for filtering out noise associated with transmissions at different frequencies, or when using PCB substrates having different dielectric constants.

Figure 4:
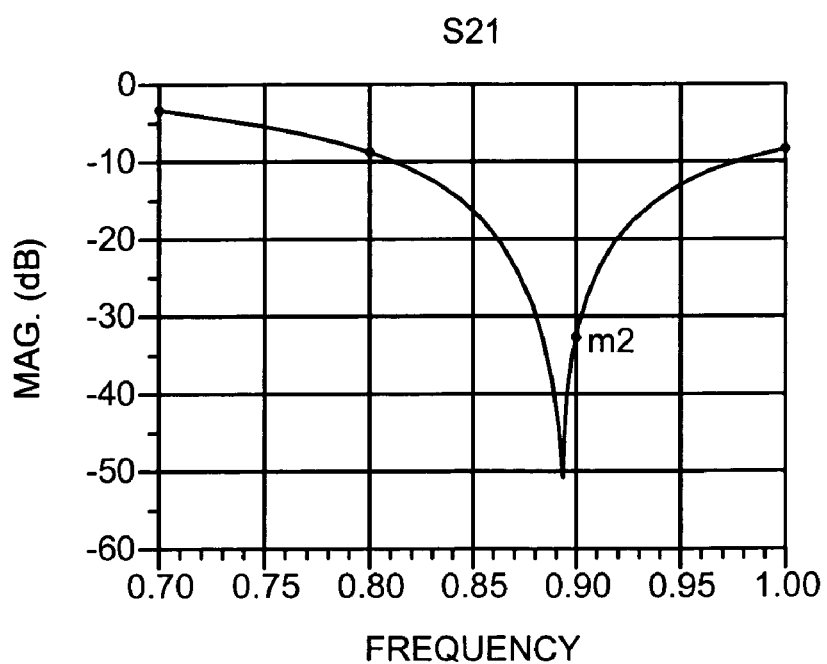
FIG. 4 is a graph illustrating an RFI attenuation curve produced by a TDD handset using a PCB, including a notch filter, such as that shown in FIGS. 1-3.

Using a PCB notch filter configuration similar to that illustrated in FIGS. 1 and 2, noise associated with a 900 MHz transmission can be attenuated by greater than 30 dB, as illustrated by point m2 in FIG. 4 (showing attenuation of approximately 32.92 dB). By comparison, a comparable ring-filter can typically attenuate noise associated with a 900 MHz transmission by approximately only 10 dB. Thus, a notch filter as described herein attenuates noise associated with a 900 MHz transmission by greater than three times that which is achieved by a conventional ring-filter.

The PCB 10 may be constructed in any conventional, or other suitable, manner. For example, the filter line 36 may be formed in the conductor layers of the PCB 10 via photolithography (the use of photomask and chemical etching to remove foil from the substrate), milling (using a 2 or 3 axis mechanical milling system to mill away foil from the substrate), printing (using conductive ink or epoxy to form traces directly on the substrate material), or any other suitable method. Alternatively, separate filter line 36 may be laid on the conductor layers.

Once constructed, the PCB 10 is preferably inserted into and integrated with the components in a TDD handset, or other suitable telecommunications device, in any conventional, or other suitable, manner. When the TDD handset is used to transmit a signal, the signal enters the PCB 10 at the "signal in" end 32 of the signal line 30. Frequencies within a specified narrow range (i.e., the specified range of frequencies that cause "noise"), travel along the filter line 36 and exit at the open end 50 of the filter line, thus substantially removing noise from the transmission. The remaining frequencies are allowed to bypass the filter line 36 and exit through the "signal out" end 34 of the signal line 30, thus producing a substantially clear transmission.

The PCB 10, including a notch filter, or other suitable filter, described herein, provides several advantages. First, the filter is relatively low-cost, and the substrate material used provides a relatively low equivalent wavelength for waves traveling within the PCB material. Additionally, by laying the filter line 36 on or in multiple conductor layers, the filter occupies a relatively low amount of surface area on each conductor layer, leaving more space available for mounting devices, and for further integrating the PCB 10 into a TDD handset, or other telecommunications device.

While embodiments and applications of the present invention have been shown and described, it will be apparent to one skilled in the art that other modifications are possible without departing from the inventive concepts herein. The invention, therefore, is not to be restricted except by the following claims and their equivalents.

What is claimed is:

1. A communication device including a filter on a printed circuit board for attenuating RFI in transmissions sent by the communication device, with the printed circuit board comprising:
   a first conductor layer;
   a second conductor layer;
   a first substrate layer between the first and second conductor layers; and
   a filter line formed in and running between the first and second conductor layers in a substantially repeating pattern, wherein the filter line is open ended;
   wherein the printed circuit board further includes a signal line connected to the filter line for receiving an incoming signal, sending at least a first portion of the signal to the filter line, and transmitting at least a second portion of the signal.

2. The communication device of claim 1 wherein a sufficient length of the filter line is formed in the first and second conductor layers to attenuate noise associated with a 900 MHz transmission frequency by at least 30 dB.

3. The communication device of claim 1 wherein the filter line is 40 to 50 mm in length.

4. The communication device of claim 1 wherein the first substrate layer includes a plurality of holes through which the filter line runs between the first and second conductor layers.

5. The communication device of claim 1 wherein the signal line is located in the first conductor layer.

6. The communication device of claim 1 wherein the printed circuit board further comprises a second substrate layer on top of the first conductor layer, and a third substrate layer beneath the second conductor layer.

7. The communication device of claim 6 wherein the printed circuit board further comprises a first ground layer on top of the second substrate layer, and a second ground layer beneath the third substrate layer.

8. The communication device of claim 6 wherein at least one of the first, second, and third substrate layers comprises a fiberglass material.

9. The communication device of claim 6 wherein each of the first, second, and third substrate layers has a thickness of 80 to 120 micrometers.

10. The communication device of claim 6 wherein the printed circuit board further comprises:
    a third conductor layer beneath the third substrate layer;
    a fourth substrate layer beneath the third conductor layer;
    a fourth conductor layer beneath the fourth substrate layer; and
    a fifth substrate layer beneath the fourth conductor layer.

11. The communication device of claim 1 wherein the first substrate layer comprises a material having a dielectric constant of at least 4.0.

12. A communication device including a filter on a printed circuit board for attenuating RFI in transmissions sent by the communication device, with the printed circuit board comprising:
    a first conductor layer;
    a second conductor layer;
    a first substrate layer between the first and second conductor layers;
    a filter line formed in and running between the first and second conductor layers in a substantially repeating pattern; and
    a signal line connected to the filter line for receiving an incoming signal, sending at least a first portion of the signal to the filter line, and transmitting at least a second portion of the signal, wherein the signal line is located in the first conductor layer.

13. A communication device including a filter on a printed circuit board for attenuating RFI in transmissions sent by the communication device, with the printed circuit board comprising:
    a first conductor layer;
    a second conductor layer;
    a first substrate layer between the first and second conductor layers;
    a second substrate layer on top of the first conductor layer;
    a third substrate layer beneath the second conductor layer;
    a third conductor layer beneath the third substrate layer;
    a fourth substrate layer beneath the third conductor layer;
    a fourth conductor layer beneath the fourth substrate layer;
    a fifth substrate layer beneath the fourth conductor layer; and
    a filter line formed in and running between the conductor layers in a substantially repeating pattern;
    wherein the printed circuit board further includes a signal line connected to the filter line for receiving an incoming signal, sending at least a first portion of the signal to the filter line, and transmitting at least a second portion of the signal.

* * * * *